United States Patent [19]

Brochot et al.

[11] Patent Number: 5,011,585

[45] Date of Patent: Apr. 30, 1991

[54] PROCESS FOR PRODUCING A TRANSPARENT LAYER WITH LOW RESISTIVITY

[75] Inventors: Jean-Pierre Brochot, Paris; Danielle Pillias, Aulnay Sous Bois; Isabelle Wuest, Paris, all of France; Jean-Pierre Beaufays, Jemeppe Sur Sambre; Maurice Darmont, Sambreville, both of Belgium

[73] Assignee: Saint-Gobain Vitrage, France

[21] Appl. No.: 376,711

[22] Filed: Jul. 7, 1989

[51] Int. Cl.$^5$ ............................................. C23C 14/54
[52] U.S. Cl. ....................... 204/192.130; 204/192.290
[58] Field of Search ...................... 204/192.13, 192.29

[56] References Cited

U.S. PATENT DOCUMENTS

| | | | |
|---|---|---|---|
| 3,655,545 | 4/1972 | Gillery et al. | 204/192.29 |
| 3,749,658 | 7/1973 | Vossen, Jr. | 204/192.29 |
| 4,407,709 | 10/1983 | Enjouji et al. | 204/192.13 |

FOREIGN PATENT DOCUMENTS

| | | | |
|---|---|---|---|
| 205193 | 12/1983 | German Democratic Rep. | 204/192.29 |
| 63-250459 | 10/1988 | Japan | 204/192.29 |

*Primary Examiner*—Aaron Weisstuch
*Attorney, Agent, or Firm*—Pennie & Edmonds

[57] ABSTRACT

A method for depositing on glass, by reactive cathode sputtering, a layer of indium tin oxide with low resistivity and high transparency, where a layer with at least a minimum intrinsic absorption coefficient is deposited and then a heat treatment, including of one reducing phase, is performed.

18 Claims, 3 Drawing Sheets

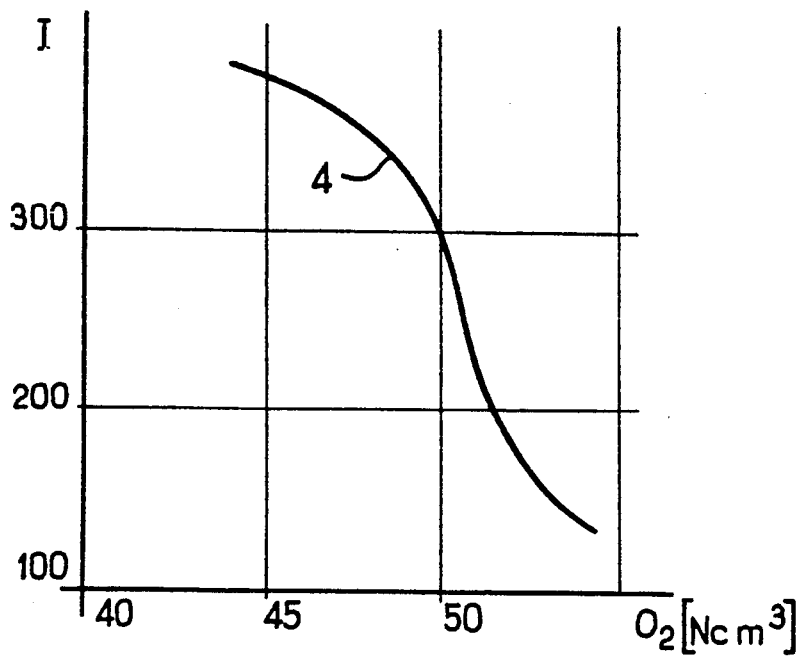
FIG_2
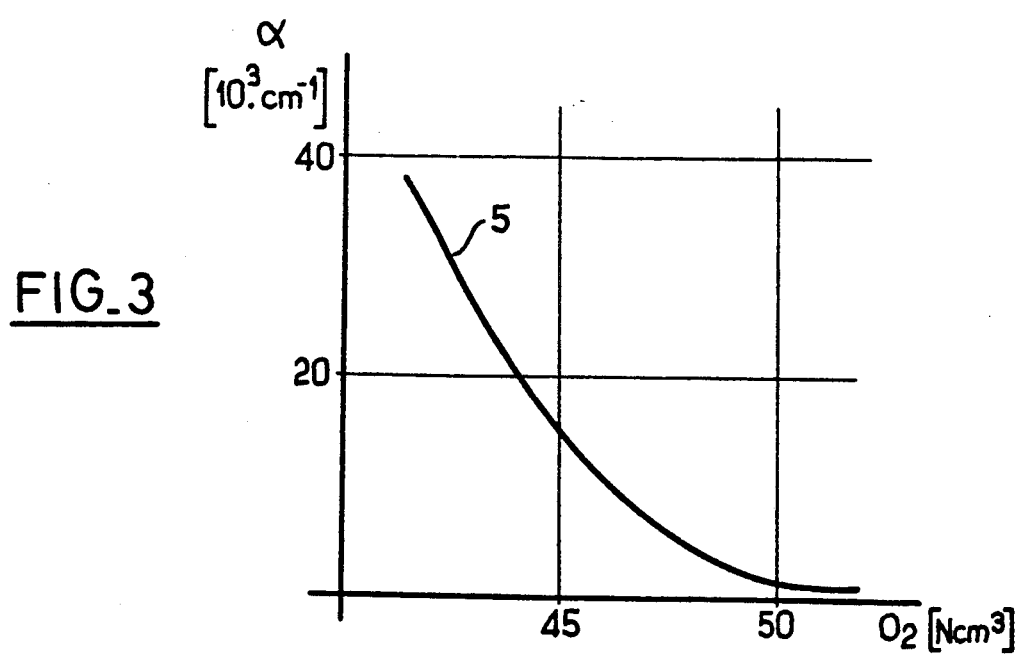
FIG_3

PROCESS FOR PRODUCING A TRANSPARENT LAYER WITH LOW RESISTIVITY

BACKGROUND OF THE INVENTION

This invention relates to conductive transparent layers which have an indium oxide base doped with tin ("ITO"), and in particular, to those layers obtained by cathode sputtering on a glass substrate.

In many applications of transparent conductive layers as for instance in the case of an electrically heated windshield, it is desirable that a layer with a given thickness (which is usually determined for optical reasons) have the highest electrical efficiency. The resistivity of the layer is a good measure of this efficiency. The lower the resistivity, the higher the efficiency.

Of the methods proposed for producing transparent conductive layers with an indium oxide base doped with tin ("ITO"), the most common are vacuum techniques, one such technique being reactive cathode sputtering from a metal target composed of an alloy of indium and tin. This technique is similar to the method described in U.S. Pat. No. 4,336,119 which is incorporated herein by reference. However, this method achieves inadequate results because the layers that are obtained are neither very transparent nor very conductive.

A solution proposed in U.S. Pat. No. 4,512,864, which teaches heating the substrate before deposition of the layer, significantly improves matters and makes it possible to obtain good transparencies as well as good conductivities. However, on an industrial scale, there are considerable technical difficulties in introducing hot glass into a unit under vacuum and maintaining its temperature for the period of time needed to deposit a thick layer.

The same result may be achieved by (1) cathode sputtering on a cold glass support followed by (2) heat treatments. For example, CA Patent 566,773 (or GB 718,189) which is incorporated herein by reference proposes that ITO be deposited under substoichiometric conditions in oxygen and then the light transmission of the layer be increased by removing the glass support and deposited layer from the vacuum unit and raising their temperature to 350° C. for five minutes. This process generally results in a transparent layer, but one that is not very conductive. Therefore, a second heat treatment in reducing atmosphere has been proposed in CA Patent 1,045,918 (or GB 1,498,142) to improve conductivity.

U.S. Pat. No. 4,490,227 also describes a similar process. In this process, a layer of ITO that is deposited by reactive cathode sputtering is subjected to the bending of the support glass, without cracking, and still retains minimum final optical properties. Since the general transmission conditions of this process are defined independently of the thickness of the layer, the intrinsic qualities of the layer are not taken into account.

Despite these developments it still is quite difficult to obtain conductive coatings of sufficiently low resistivity in an industrial scale process.

SUMMARY OF THE INVENTION

Accordingly, an object of this invention is to improve the manufacture of conductive coatings having desired properties. More particularly, it is an object of this invention to precisely define the conditions that must be observed in reactive cathode sputtering of an ITO layer to guarantee the highest electrical conductivity in a final product of any given thickness. A further object of the invention is to obtain given optical and electrical performance at a minimum thickness.

Still another object of the invention is to precisely define the conditions for using the process of reactive cathode sputtering in order to produce, with high industrial yields, flat or bent glazings that are coated with a layer of indium tin oxide of minimum resistivity.

The present invention is a process for coating glass with a transparent conductive layer that has an indium base doped with tin and oxidized and having a resistivity less than $3.5 \times 10^{-4}$ ohms.cm. This process comprises the following steps:

(a) substoichiometric reactive depositing of indium tin oxide by cathode sputtering from a target of an indium alloy comprising at least 2% tin. The intrinsic absorption coefficient of the suboxidized layer obtained is at least 7,500 cm$^{-1}$ for light with a wavelength of 550 nm.

(b) heat treating the layer using at least one phase that is reducing. In some instances the indium tin oxide layer can have a resistivity less than $2.5 \times 10^{-4}$ ohms$\times$cm and an intrinsic absorption coefficient of approximately 25000 cm$^{-1}$. Illustrative time periods for the heat treating step are 15 or 30 minutes. An oxidizing treatment may also be used having a comparable duration.

Further, in accordance with the invention the sputtering process is controlled by monitoring the emission spectrum of the plasma surrounding the cathode and regulating stoichiometry during the sputtering process so as to attain a desired absorption coefficient in the sputtered layer. Any optical characteristics of the plasma can be measured, particularly the characteristic emission lines, and, specifically the characteristic emission lines of indium and/or oxygen.

This reliable and reproducible method provides a layer of desired thickness having a conductivity that is independent of the thickness of the layer.

BRIEF DESCRIPTION OF DRAWING

These and other objects, features and advantages of the present invention will be more readily apparent from the following detailed description of the invention in which:

FIG. 2 is a graph representing the experimental relationship between the light intensity of the indium line in the plasma during deposition and the oxygen level in the atmosphere of the enclosure, FIG. 3 is a graph depicting the interdependence between the absorption coefficient and the level of oxygen in the enclosure.

DETAILED DESCRIPTION OF INVENTION

Figure 1:
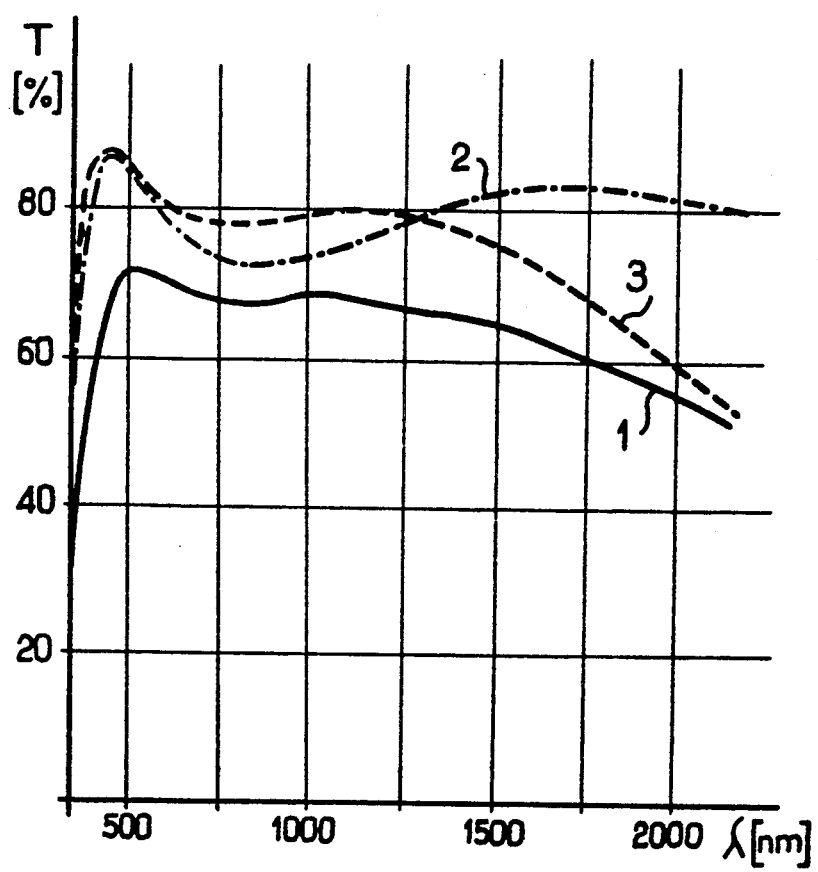
FIG. 1 is a graph depicting changes in the light transmission through a glass substrate coated with an ITO layer during the production phases.

During the successive phases of the production of an ITO layer with high conductivity, the optical characteristics clearly change. FIG. 1 depicts for three successive stages the percent light transmission through a sample comprising an ITO layer with a thickness of 90 nm deposited on 4 mm soda lime silica glass. Curve 1 represents the light transmission through the sample as it leaves the cathode sputtering unit at which point the sputtered ITO layer is suboxygenated. Curve 2 represents the same sample after a 20 minute long heat treatment in the air at 550° C. Curve 3 shows the transmission of the finished sample after it is annealed at 500° C. for 30 minutes in a nitrogen atmosphere having 1% hydrogen.

The intrinsic absorption coefficient α may be determined from the following formula:

$$T = (1-R)e^{-\alpha d} \tag{1}$$

where T is the light transmission coefficient of the layer, R is the light reflection coefficient of the layer and d is the thickness of the layer. Rearranging terms we have:

$$\alpha = \frac{-\ln \frac{T}{1-R}}{d} \tag{2}$$

At 550 nm the light reflected is 0.15, and from curve 1 of FIG. 1 the light transmission is 0.72. It follows that the absorption coefficient, $\alpha_{550}$, of the suboxygenated layer is equal to:

$$\alpha_{550} = \frac{-\ln \frac{0.72}{1-0.15}}{90 \times 10^{-7} \text{ cm}} \tag{3}$$

$$= 18,000 \text{ cm}^{-1}$$

Since application of equation (1) to FIG. 1 does not take into account the interferential aspect of the layer, for a more precise calculation the optical formulas for thin layers developed by Abeles (*Advanced Optical Techniques*, 1967, pp. 143-188, North Holland Publ. Co.) should be used. It should also be noted that the absorption coefficient in the above formula is not exactly equal to the absorption coefficient $$\frac{4\pi k}{\lambda},$$

where k is the absorption index of the layer at the wavelength λ. However, use of equation (1) to calculate the absorption coefficient is advantageous because it is simple (it suffices to measure R and T), and it is valid over the range from $2 \times 10^3$ cm$^{-1}$ to $100 \times 10^3$ cm$^{-1}$. Within this range the difference is less than 15%.

FIG. 2 relates to optical measurements made with a monochromator which is adjusted to the emission wavelength of indium (3256 Angstroms) and is equipped with an optical device which is aimed at the plasma surrounding the cathode during sputtering. Curve 4 shows the variations in the intensity of the indium line (relative units) as a function of the oxygen flow (cubic centimeters reduced to normal temperature and pressure conditions for one minute).

In an industrial cathode sputtering unit, the partial pressure of the different gases varies for different locations as a function of the placement of the gas intakes, the presence or absence of the substrate, etc. Furthermore, this partial pressure varies according to the production phase in progress. In the case of reactive cathode sputtering, particularly in the oxidation of indium tin, the chemical reaction occurs between the time when the metal particle is torn from the target and the time when the layer deposited on the substrate leaves the area of the reactive plasma. In order to control the oxidation reaction, it is known to monitor the luminescence of the plasma. Thus, U.S. Pat. No. 4,407,709 which is incorporated herein by reference proposes to maintain the light emission constant to stabilize the reaction. Curve 4 of FIG. 2 makes it possible, on any given unit, to determine the actual stoichiometric conditions by making a simple spectral measurement.

Accordingly, these conditions can be controlled by varying the composition of the gases supplied to the sputtering enclosure or by varying the voltage applied to the cathode until the desired intensity is observed in the spectral line being monitored.

FIG. 3 shows the relationship between the conditions for oxidizing the ITO deposit through reactive cathode sputtering, and the intrinsic absorption coefficient $\alpha_{550}$ of the layer obtained as it leaves the vacuum unit. The flow of oxygen is shown on the X axis, which represents the number of cubic centimeters under normal temperature and pressure conditions that is introduced into the vacuum unit each minute. The coefficient $\alpha_{550}$, shown on the Y-axis, is expressed here in units of $10^3$ cm$^{-1}$. Curve 5 of FIG. 3, like curve 4 of FIG. 2, serves to calibrate the unit. When it is desired to obtain a layer whose intrinsic absorption coefficient is greater than a certain threshold, curve 5 makes it possible to determine what oxygen levels in the atmosphere are necessary to obtain this layer. Similarly, at a second point in time, it is possible to use curve 4 of FIG. 2 to determine what light intensities must be maintained for the indium line in the plasma to ensure that the proper level of oxygen is sustained to obtain good values of $\alpha_{550}$.

Figure 4:
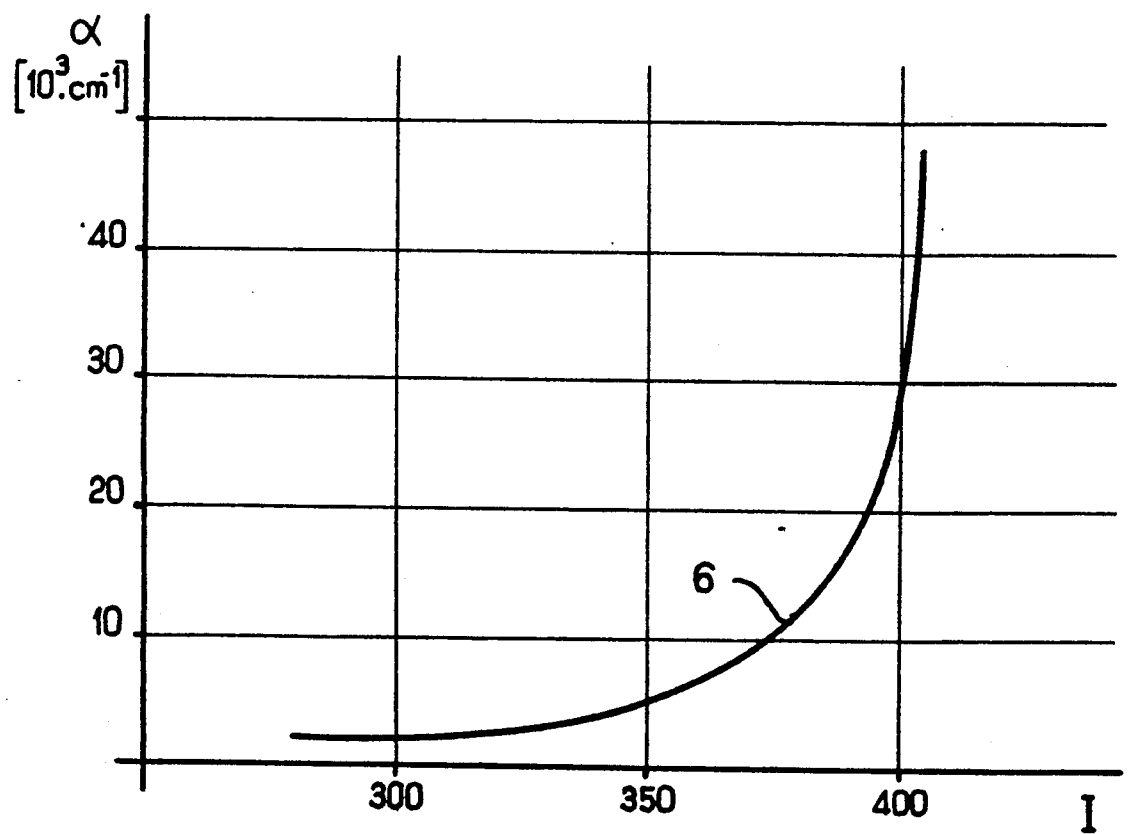
FIG. 4 is a graph depicting the relationship between the intrinsic absorption coefficient and the light intensity of the indium line in the plasma.

In order to simplify the control of the reaction, it is preferable to use a curve similar to that of curve 6 in FIG. 4. This makes it possible to link the absorption coefficient of the layer directly with the light intensity of the indium line for any given unit and any defined deposition condition. Thus, it is possible to identify the spectral conditions at which an ITO layer has the desired absorption coefficient and to vary the process operations for the unit in question until the desired spectral conditions are observed.

The following description will clarify the use of the invention and will be illustrated with examples.

Each cathode sputtering unit has its own characteristics. Thus, it is very difficult to extrapolate the conditions of one unit onto another in order to obtain the same results. It is the purpose of the proposed method to simplify this transposition in the case of ITO layers.

The following procedure is used in accordance with the invention to produce an ITO layer using a cathode sputtering unit. The unit is equipped with a cathode which has a target composed of an alloy of indium and tin. The alloy must contain at least 2% tin by weight and preferably contains 10% tin by weight. The unit is also equipped with an optical sighting system, which make it possible to obtain the image of the plasma surrounding the target at the time of sputtering on the input slit of a monochromator. It is preferable to adjust the monochromator on a characteristic line. For example, the indium line, the wave length of which is close to 3256 Angstrom is advantageous to choose. However, the monochromator could also monitor an oxygen line or any other optical magnitude measured on the plasma. At the output of the monochromator, a detector, such as a photoelectric cell, makes it possible to measure an electrical signal proportional to the intensity of the line in question. Moreover, the usual gases may be introduced into the enclosure, such as argon, which may be mixed with oxygen in variable proportions.

The first phase consists of calibrating the unit, i.e., in finding curves analogous to those of FIGS. 2-4.

After the unit has been placed under the usual vacuum and electrical conditions (voltage and power in watts) which are applied to the cathode, the variable proportions of oxygen are introduced into the argon. After stabilization, the signal from the cell in front of the output window of the monochromator is measured.

Through this process, a number of samples of ITO layers are made on glass supports which are introduced into the enclosure at ordinary temperature. Each sample corresponds to given deposition conditions, particularly with regard to the parameters of pressure, flow of gases, voltage, power, passing speed, etc...

After the samples leave the unit, they are measured. For example, the thickness of each layer is determined by a mechanical sensor, and its coefficient of transmission "$T_{550}$" and coefficient of reflection "$R_{550}$" are measured by a spectrophotometer at a wavelength of 550 nanometers. The intrinsic absorption coefficient of the layer, $\alpha_{550}$, is then calculated by using the regular formula. The different values of $\alpha$ are associated with the corresponding values of the oxygen level, and in turn, each one is associated to the light intensity of the indium line in the plasma at the time of the deposition. These different values of $\alpha$ make it possible to calibrate the unit, and in particular, to plot a curve similar to curve 6 of FIG. 4 which relates the absorption coefficient to the observed intensity of a line in the plasma surrounding the cathode of the sputtering unit.

The utility of the invention is dependent on the ability to produce sputtering conditions which provide $\alpha_{550}$ with a value greater than 7,500 cm$^{-1}$. Surprisingly, it was observed that if the intrinsic absorption coefficient of the layer on leaving the sputtering unit exceeded the value of 7,500 cm$^{-1}$, then the resistivity at the termination of the usual heat treatments would be optimal, i.e., less than $3.5 \times 10^{-4}$, and usually $2 \times 10^{-4}$ ohm centimeters. (The evaluation of the resistivity "$\rho$" is done according to common methods. After measuring the resistance, R, of the layer by the four point method, $\pi$ is calculated as follows: $\pi = R \times d$ where d is the thickness of the layer.)

Accordingly, in the practice of the invention, after the unit is calibrated to produce a curve similar to curve 6 of FIG. 4, the calibration curve is used in control of the sputtering process so as to produce a layer that has an absorption coefficient that exceeds the value of 7,500 cm$^{-1}$. This is done by monitoring the intensity of the plasma surrounding the cathode and controlling a parameter such as oxygen flow to the sputtering enclosure or voltage to the cathode so that the intensity corresponds to an absorption coefficient greater than 7,500 cm$^{-1}$ as specified by the calibration curve.

After sputtering, several heat treatments are used to complete the production process of glass with an ITO layer. An initial heat treatment with an oxidizing atmosphere is preferable because it increases the transparency of the layer. Since the treatment can be proportionally shorter as the temperature gets higher, it can be performed during the heat bending of the glass. This treatment may be terminated when the light transmission of the layer is stabilized, but it may also continue for other reasons.

The second heat treatment to be performed must have a reducing effect on the layer. It is preferable to perform this treatment in a reducing atmosphere, such as one composed of nitrogen and hydrogen or of nitrogen and carbon monoxide, even though the treatment could also be done under vacuum. Alternatively, the heat treatment may be done immediately at the end of the oxidizing treatment, before the sample is cool. For example, the treatment may be performed upon leaving the heat bending phase of the glass.

The following three examples show how the application of the method leads to the desired result. The fourth example shows what happens when one does not practice the invention. In each of the four examples the light transmission coefficient (T) and the light reflection coefficient (R) were measured by a spectrophotometer, and the value of the intrinsic absorption coefficient was calculated according to formula (2). In the first three examples, the deposition conditions are controlled so that the intensity of the spectral line of the plasma, which is measured during the sputtering process, corresponds to the desired intrinsic absorption coefficient as specified by the previously determined calibration curve.

Example 1: The cathode sputtering unit has a large volume. A vertical cathode is 9 cm in width and is of the type described in U.S. Pat. No. 4,116,806 which is incorporated herein by reference. The target is made of an alloy of indium tin, 90-10 (by weight). The support glass is vertical and mobile. It has a thickness of 4 mm and it has dimensions of 30×30 cm. The glass moves in front of the cathode at a speed of 10 cm/minute, with power applied at 0.5 watt/cm$^2$. The carrier gas is argon and the pressure of the enclosure is 3 millitors. The flow of oxygen is 170 cm$^3$/minute (reduced to normal temperature and pressure conditions, "NTPC"). The sample passes in front of the cathode five times.

The sample is measured when it leaves the unit. The thickness of the layer is 330 nm and its light absorption is 28.0% at a wavelength of 550 nm. These measurements correspond to an intrinsic absorption coefficient of 10,000 cm$^{-1}$. In addition, the electrical resistance is 160 ohms per square, which corresponds to a resistivity of $5.3 \times 10^{-3}$ ohms.cm.

Once the layer is deposited, two heat treatments are performed. First, the sample is raised to a temperature of 550° C. in the ambient atmosphere for 30 minutes. After this initial oxidizing annealing is complete, the sample is then brought to 525° C. for thirty minutes in an atmosphere of 99% nitrogen and 1% hydrogen. When the second heat treatment is finished and the sample is cooled, its optical and electrical characteristics are remeasured. The absorption of the sample at 550 nm is now only 6%. The surface resistance is 8.8 ohms per square. The calculated resistivity of the layer is $\rho = 2.9 \times 10^{-4}$ ohms.cm.

Example 2: A laboratory cathode sputtering unit is equipped with cathodes 12 cm in width. These cathodes are similar to those described in U.S. Pat. No. 4,166,018 which is incorporated herein by reference. The horizontal target is made of an alloy of indium tin 90-10 (by weight), and is above the substrate. The substrate moves in front of the target at a distance of 8 cm.

The electrical power is 1.2 W/cm$^2$. The carrier gas, argon, produces the sputtering, and oxygen is introduced into the argon at a rate of 13 cm$^3$/minute (NTPC). The overall pressure is 8 millitors. A single pass is made in front of the target at a speed of 4 cm/minute. A layer with a thickness of 510 nm and an absorption "A" of 62%, is obtained. This corresponds to an absorption coefficient of 23,000 cm$^{-1}$. The electrical resistance of the layer is 18 ohms per square, which corresponds to a resistivity of 10$^{-3}$ ohm cm.

After the layer is deposited, the two heat treatments are performed. The first heat treatment is done in air at 500° C. for 30 minutes, and the second treatment is done in a nitrogen atmosphere with 1% hydrogen for 30 minutes. The final measurements have indicated that the ITO layer had good transparency (A$_{550}$=10%) and good conductivity ($\rho$=1.8 10$^{-4}$ ohm.cm).

Example 3: The cathode sputtering unit and the surrounding conditions for the invention are similar to those found in example 1, with the following exceptions:

flow of oxygen: 100 cm$^3$/minute (NTPC)
power: 0.38 W/cm$^2$
speed: 8.6 cm/minute
number of passes: 6

The heat treatments were also conducted in an identical manner to those of example 1.

The results were:

layer before the annealings: thickness 400 nm $$\alpha_{550} = 12,000 \text{ cm}^{-1}$$

$$\rho = 8 \times 10^{-3} \text{ ohm.cm}$$

After the heat treatments were performed, the absorption at a wavelength of 550 nm was 5%, and the resistivity was 2.8×10$^{-4}$ ohm.cm.

Example 4: This example presents by way of comparison the results achieved when a layer is deposited without the control of the sputtering process that is achieved by use of the calibration curve in the practice of the invention. The cathode sputtering unit and conditions are the same as those in example 3, except that the sample makes only four passes in front of the cathode and a different voltage and current are used to provide the same power to the cathode.

When the sample leaves the vacuum unit, the characteristics of the layer are measured. The thickness of the layer is 270 nm, its square resistance is 148 ohms, and its absorption at a wavelength of 550 nm is 12.0%. Consequently, the calculations yield: $\alpha_{550}$=5×10$^3$ cm$^{-1}$ and $\rho$=4×10$^{-3}$ ohm.cm.

The sample is then subjected to the heat treatments described in example 1, and after cooling, the characteristics of the ITO layer are remeasured. The absorption, at a wavelength of 550 nm, is 4.0% and the resistivity is 4.7×10$^{-4}$ ohm.cm.

Thus, it is apparent from these four examples, where the first three are performed according to the invention, that the method shown by the invention makes it possible, through simple calibrations of the unit, to obtain ITO layers that are transparent and extremely conductive on different units and under very diverse conditions. These transparent and conductive ITO layers are obtained by monitoring the light emission characteristics of the plasma during deposition of the layer and controlling the stoichiometry to achieve light emission characteristics that are known to be associated with ITO layers having desired properties.

As will be apparent to those skilled in the art, numerous variations may be made in the practice of the invention. While the process of the invention has been described in terms of the deposition of ITO on glass, it will be appreciated that the ITO layer may be deposited on other substrates as well.

What is claimed is:

1. A process for coating a transparent substrate with a highly conductive, transparent layer having an indium based doped with tin and oxidized and having a resistivity less than 3.5×10$^{-4}$ ohms.cm, comprising the following steps:

depositing a layer of indium tin oxide on glass at substoichiometric conditions by cathode sputtering from a target of an indium alloy comprising at least 2% tin by weight, controlling said cathode sputtering to produce a layer having an intrinsic absorption coefficient that is equal to or greater than 7,500 cm$^{-1}$ at a wavelength of 550 nm, and heat treating said layer after deposition on said glass using a reducing phase.

2. The process according to claim 1 wherein the intrinsic absorption coefficient of the layer after deposition is greater than 10,000 cm$^{-1}$.

3. The process according to claim 1 wherein the layer has a resistivity less than 2.5×10$^{-4}$ ohms.cm and an intrinsic absorption coefficient of approximately 25,000 cm$^{-1}$.

4. The process according to claim 1 wherein the reducing phase in the heat treating step is performed in a reducing atmosphere.

5. The process according to claim 4 wherein the reducing atmosphere comprises a neutral gas and a reducing gas in a concentration of at least 1%.

6. The process according to claim 5 wherein the reducing gas is hydrogen.

7. The process according to claim 6 wherein the temperature during the heat treating step is at least 500° C.

8. The process according to claim 5 wherein the reducing gas is carbon monoxide.

9. The process according to claim 4 wherein the reducing phase of the heat treating step has a duration of about 15 minutes.

10. The process according to claim 1 wherein the reducing phase of the heat treatment is preceded by an oxidizing phase.

11. The process according to claim 10 wherein the oxidizing phase is performed at a minimum of 500° C.

12. The process according to claim 10 wherein the oxidizing phase has a duration of approximately 15 minutes.

13. A process for coating a transparent substrate with a highly conductive, transparent layer having an indium base doped with tin and oxidized and having a resistivity less than 3.5×10$^{-4}$ ohms.cm, comprising the steps of:

calibrating a cathode sputtering process to determine a relationship between an absorption coefficient of a layer of indium doped with tin and oxidized that is formed by said cathode sputtering process and an intensity of a spectral line in a plasma formed at a cathode during said sputtering;

depositing a layer of indium tin oxide on said transparent substrate at substoichiometric conditions by cathode sputtering from a target of an indium alloy comprising at least 2% tin by weight, during said sputtering, measuring the intensity of said spectral line in the plasma formed at the cathode during said sputtering;

controlling the cathode sputtering process so that the measured intensity corresponds to an intrinsic absorption coefficient that is equal to or greater than 7,500 cm$^{-1}$ at a wavelength of 550 nm as determined during said calibration step; and heat treating said layer after deposition on said glass using a reducing phase.

14. The method of claim 13 wherein the cathode sputtering process is controlled by varying gas composition.

15. The method of claim 13 wherein the cathode sputtering process is controlled by varying the voltage applied to the cathode.

16. A process for coating a transparent substrate with a highly conductive, transparent layer having an indium base doped with tin and oxidized and having a resistivity less than $3.5 \times 10^{-4}$ ohms.cm, comprising the steps of:

calibrating the process by forming a plurality of samples by:

depositing a layer of indium tin oxide on a plurality of glass samples at substoichiometric conditions by cathode sputtering from a target of an indium alloy;

measuring the intensities of a spectral line in a plasma formed at the cathode during said sputtering;

measuring the intrinsic absorption coefficient of each glass sample; and establishing a relationship between the measured intensities and the measured intrinsic absorption coefficients;

depositing a layer of indium tin oxide on a transparent substrate at substoichiometric conditions by cathode sputtering from a target of an indium alloy comprising at least 2% tin by weight, where the layer obtained has an intrinsic absorption coefficient that is equal to or greater than 7,500 cm$^{-1}$ at a wavelength of 550 nm;

during said sputtering, measuring the intensity of said spectral line in the plasma formed at the cathode during said sputtering;

controlling said sputtering so that the measured intensity corresponds to the desired intrinsic absorption coefficient as specified in the relationship determined during said calibration step; and heat treating said layer after deposition on said glass using a reducing phase.

17. The method of claim 16 wherein the cathode sputtering is controlled by varying gas composition.

18. The method of claim 16 wherein the cathode sputtering is controlled by varying the voltage applied to the cathode.

* * * * *